United States Patent
Lee et al.

(10) Patent No.: US 7,190,236 B2
(45) Date of Patent: Mar. 13, 2007

(54) APPARATUS AND METHOD OF OSCILLATING WIDEBAND FREQUENCY

(75) Inventors: Kyeongho Lee, Seoul (KR); Joonbae Park, Seoul (KR); Jeong-Woo Lee, Seoul (KR); Seung-Wook Lee, Seoul (KR)

(73) Assignee: GCT Semiconductor Inc., San Jose, CA (US)

( * ) Notice: Subject to any disclaimer, the term of this patent is extended or adjusted under 35 U.S.C. 154(b) by 0 days.

(21) Appl. No.: 11/227,439

(22) Filed: Sep. 16, 2005

(65) Prior Publication Data

US 2006/0152290 A1    Jul. 13, 2006

(30) Foreign Application Priority Data

Sep. 22, 2004  (KR) ............ 10-2004-0075736

(51) Int. Cl.
*H03B 5/00* (2006.01)

(52) U.S. Cl. ............ 331/117 R; 331/167; 331/117 FE; 331/179

(58) Field of Classification Search ............ 331/117 R, 331/167, 117 FE, 179, 11
See application file for complete search history.

(56) References Cited

U.S. PATENT DOCUMENTS 6,803,830 B2 * 10/2004 Scheffler ............... 331/36 C
6,903,613 B1 *  6/2005 Mitchell et al. ............ 331/11

* cited by examiner

*Primary Examiner*—Arnold Kinkead
(74) *Attorney, Agent, or Firm*—Fleshner & Kim, LLP

(57) ABSTRACT

An apparatus and method of oscillating a wideband frequency are disclosed. The apparatus includes: a frequency oscillating unit for oscillating a predetermined frequency; a phase-locked loop for comparing the oscillated frequency and a reference frequency by feed-backing the oscillated frequency from the frequency oscillating unit and fixing an oscillating frequency of the frequency oscillating unit; and a variable dividing unit for varying a division ratio to approach to a frequency band required by the oscillating frequency and dividing the oscillating frequency.

23 Claims, 7 Drawing Sheets

APPARATUS AND METHOD OF OSCILLATING WIDEBAND FREQUENCY

FIELD OF THE INVENTION

The present invention relates to generating frequency signals, and more particularly to an apparatus and method of oscillating a frequency for expanding a tuning range by controlling a division ratio of a phase-locked loop (PLL).

DESCRIPTION OF RELATED ART

A voltage-controlled oscillator (VCO) generates a predetermined frequency of alternating current signal based on a control voltage. VCOs are widely used in wireless receivers for transmitting/receiving signals through one or more predetermined channels and therefore are typically incorporated in handheld phones, television (TV) receivers, and wireless MODEMs.

A phase-locked loop (PLL) circuit is commonly used in a VCO in wired/wireless communication systems to generate a wide range of frequencies, for example, from a low reference frequency to comparatively high frequencies.

FIG. 1 shows a phase-lock loop (PLL) circuit according to the related art. As shown, the PLL circuit 100 includes a frequency divider 150, a phase frequency detector 110, a charge pump 120, a loop filter 130, and a voltage-controlled oscillator 140. The frequency divider divides an output frequency $F_{out}$ to a predetermined frequency. The phase frequency detector 110 receives a reference frequency $F_{ref}$ from an external unit and the divided frequency from the divider 150, and then detects a phase difference and a frequency difference between the reference frequency and the divided frequency. The charge pump 120 charges and discharges the loop filter (LF) 130 by receiving the phase difference and the frequency difference from the phase frequency detector 110. The loop filter eliminates radio frequency elements from a signal output from the CP 120. The VCO 140 generates an output frequency $F_{out}$ proportional to a voltage of the LF 130.

The reference frequency $F_{out}$ is generally provided from a crystal oscillator having a ppm accuracy. The VCO oscillates a stable alternate current signal in a target frequency band through such a PLL circuit.

FIG. 2 shows a tuner of a wireless receiver which uses a VCO according to the related art. The tuner is a direct-conversion type which demodulates a predetermined frequency signal $RF_{in}$ to I and Q baseband signals. That is, the tuner receives the frequency signal $RF_{in}$ which is controlled to have a constant level through a preamplifier 210 and a gain controller 220, and mixes the received frequency signal $RF_{in}$ with an oscillating signal of a local oscillator 250 through mixers 230, 240 to generate the I baseband signal and the Q baseband signal. The local oscillator 250 generates an oscillating signal having a same frequency and 90° phase difference, and the oscillating signal is then applied to mixers 230 and 240.

The local oscillator (LO) 250 includes a VCO and a frequency distributor. The VCO generates a signal having a frequency identical to a carrier wave of a selected channel. The frequency distributor distributes the output signal of the VCO as two signals $f_{o1}$ and $f_{o2}$ having 90° phase difference. The mixers 230, 240 generate I and Q signals by mixing the input frequency and the LO signals.

Lowpass filters 260 and 270 eliminate out-of-band blocking and in-band blocking signals from the output signal of the mixers 230 and 240, respectively. Accordingly, when the local oscillator 250 generates the oscillating signals having a frequency identical to the carrier wave of the selected channel, the I baseband signal and the Q baseband signal are extracted by mixing the oscillating signals with a frequency signal of a corresponding carrier wave in mixers 230, 240.

Thus, as described above, the VCO oscillates a frequency for a receiving band of a tuner. That is, an oscillating range of the VCO must be identical to a receiving band of a corresponding wireless system.

For example, a satellite broadcasting system uses broadcasting bands from about 950 MHz to about 2.15 GHz. Accordingly, a tuner of a satellite broadcasting receiver must have an oscillation (e.g., generate frequency signals) frequency band from about 950 MHz to about 2.15 GHz.

If an oscillating range of the VCO is expressed based on a below Eq. 1, which is a maximum-minimum ratio representation, the VCO must have 125% of the oscillating range.

$$\frac{f\max - f\min}{f\min} \times 100[\%] \qquad \text{Eq. 1}$$

However, a conventional VCO having a resonator generally has about 30% of an oscillating range, and a phase noise performance may be dramatically degraded when the oscillating range of the VCO becomes wider.

In order to overcome such a problem of the conventional VCO, there are many studies in progress to expand the oscillating range of the VCO without degrading the phase noise performance. Among the studies, a VCO oscillating a wideband frequency signal using a plurality of varactor diodes has been introduced in U.S. Pat. No. 5,739,730.

FIG. 3 is a block diagram for explaining a VCO introduced in U.S. Pat. No. 5,739,730. As shown in FIG. 3, VCO 300 includes a resonating circuit 310 for resonating a signal and an active circuit 320 for oscillating and then outputting a frequency signal generated from the resonating circuit 310.

The resonating circuit 310 includes an inductance element and a capacitance element, and a tuning range of the VCO 300 is determined by the resonating circuit. That is, an oscillating frequency f of the VCO can be calculated based on an inductance L and a capacitance C of the resonating circuit in accordance with Eq. 2.

$$f = \frac{1}{2\pi\sqrt{LC}} \qquad \text{Eq. 2}$$

As indicated, structurally, resonating circuit 310 includes a plurality of varactor diodes, and an oscillating range of the VCO 300 is expanded by varying capacitance C according to a target frequency band.

The VCO depicted in FIG. 3 has drawbacks. First, phase noise performance is significantly degraded because the varactor diodes have low quality factors (Q factor) for frequency tuning.

Second, frequency oscillation may be occasionally interrupted in this circuit. More specifically, the Q factor of resonating circuit 310 is in inverse proportion to capacitance C and inductance L. In order to reduce the output frequency using a fixed inductance L, capacitance C must therefore be increased. This causes voltage swing to gradually decrease. As a result, frequency oscillation may be interrupted.

To overcome the drawbacks of this VCO, a method of using a plurality of VCOs having various frequency bands for expanding a tuning range was proposed in the article by Shinichiro Azma et al., entitled "International solid state circuit conference 2004", pp. 278~279. In order to implement this method, a wide die area must be used to include the plurality of VCOs having the various frequency bands. Also, manufacturing cost is also increased because of the plurality of the VCOs. These drawbacks serve as obstacles to miniaturizing wireless receivers and for satisfying the low price policy of most manufacturers.

A technique expanding a frequency tuning rage through various frequency dividers using a frequency signal oscillated from single VCO was introduced in Korea Patent Publication No. 2004-48439. FIG. 4 shows a frequency oscillating device introduced in this publication.

As shown in FIG. 4, frequency oscillating device 400 includes: a VCO 410 having a predetermined frequency varying range, and an expanding circuit 420 for expanding a frequency range by distributing an output signal $F_{in}$ of the VCO.

The expanding circuit 420 includes a control logic circuit 450 for selecting and controlling a frequency distributor according to a target frequency. The frequency distributor includes a ½ divider 430, a ¼ divider 440, and a plurality of switches.

The control logic unit 450 selects one of the ½ divider and ¼ divider according to a target tuning frequency by controlling the plurality of switches in order to expand a predetermined range of a frequency signal oscillated and output from single VCO 410 to various frequency bands.

Through this technique, phase noise and consumption of current are reduced, and the tuning range is widely expanded by the switching elements of the VCO. However, a sub-harmonic signal is generated while mixing a signal fed back through the various dividers and the oscillated signal from the VCO 410. Performance is degraded as a result of the sub-harmonic signal. This is very undesirable, especially because it is very complicated to eliminate the sub-harmonic signal for obtaining target signal elements. Therefore, it is expected that there may be many difficulties to commercialize the technique introduced in Korea Patent Publication No. 2004-48439.

A need therefore exists for a frequency oscillating device which can realize an expanded tuning range while simultaneously maintaining low phase noise.

SUMMARY OF THE INVENTION

It is one object of the present invention to provide an apparatus and method of oscillating a wideband frequency while maintaining a low phase noise, by including a variable frequency divider in a PLL circuit and controlling the variable frequency divider according to a target frequency band.

It is another object of the present invention to provide an apparatus and method of oscillating a wideband frequency by automatically tracing and controlling a variable frequency division ratio to a target frequency, according to a result of comparing a reference frequency and a feedback signal without requiring an oscillating frequency matching table.

It is another object of the present invention to provide an apparatus and method of oscillating a wideband frequency for preventing the generation of sub-harmonic signals that degrade performance.

It is another object of the present invention to provide an apparatus and method of oscillating a wideband frequency for properly generating I (In-phase) signal and Q (Quadrature) signals.

In accordance with one embodiment, the present invention provides an apparatus for oscillating a wideband frequency, the apparatus including: a frequency oscillating unit for oscillating a predetermined frequency, a phase-locked loop for comparing the oscillated frequency and a reference frequency by feed-backing the oscillated frequency from the frequency oscillating unit and fixing an oscillating frequency of the frequency oscillating unit, and a variable dividing unit for varying a division ratio to approach to a frequency band required by the oscillating frequency and dividing the oscillating frequency.

In accordance with another embodiment, the present invention provides an apparatus for selectively oscillating a target frequency in a wide frequency band, the apparatus including: a frequency oscillating unit for oscillating an alternate current frequency in a stable operation range by a phase-locked loop, a first controlling unit for controlling a variable division ratio based on the oscillated frequency to be approached to the target frequency, and a second controlling unit for finely controlling a frequency controlled by the first controlling unit to be matched to the target frequency.

In accordance with another embodiment, the present invention provides a wideband frequency oscillating apparatus of controlling an oscillating frequency of a phase-locked loop using a variable divider, the wideband frequency oscillating apparatus including: an initializing unit for initializing a division ratio of the variable divider, an detecting unit for detecting a feedback frequency of the phase-locked loop, a comparing unit for detecting a frequency difference by comparing a reference frequency of the phase-locked loop and the detected feedback frequency, and a division ratio controlling unit for increasing, decreasing or fixing the division ratio according to the detected frequency difference.

In accordance with another embodiment, the present invention provides a method of oscillating a wideband frequency, the method including: oscillating a predetermined frequency, comparing the oscillated frequency and a reference frequency by feeding back the oscillated frequency, and fixing an oscillating frequency oscillated in the oscillating of a predetermined frequency, and varying a division ratio to be approached to a frequency band required by the oscillating frequency.

In accordance with another embodiment, the present invention provides a method of selectively oscillating a target frequency in a wide frequency band, the method including: oscillating an alternate current frequency in a stable operation range by a phase-locked loop, controlling a variable division ratio based on the oscillated frequency to be approached to the target frequency, and finely controlling a frequency controlled in the controlling of a variable division ratio to be matched to the target frequency.

In accordance with another embodiment, the present invention provides a method of controlling an oscillating frequency of a phase-locked loop using a variable divider for oscillating a wideband frequency, the method including: initializing a division ratio of the variable divider, detecting a feedback frequency of the phase-locked loop, detecting a frequency difference by comparing a reference frequency of the phase-locked loop and the detected feedback frequency, and increasing, decreasing or fixing the division ratio according to the detected frequency difference.

DETAILED DESCRIPTION OF THE INVENTION

Figure 1:
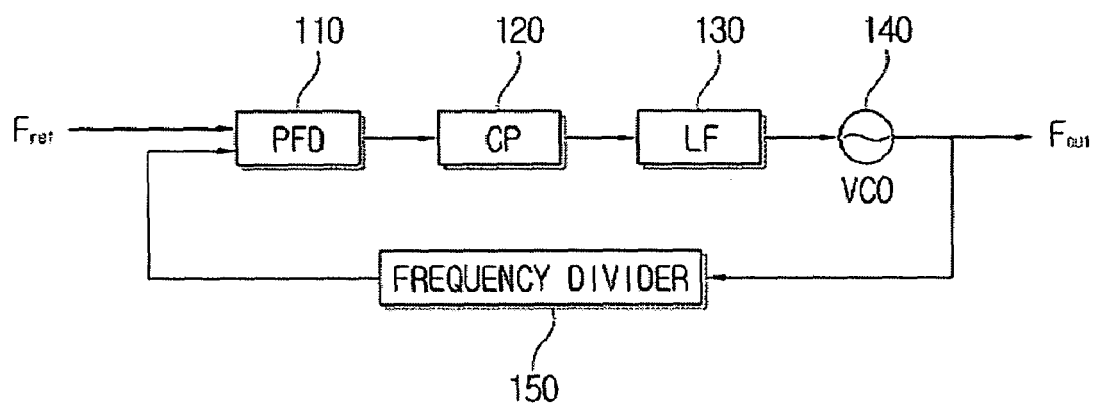
FIG. 1 is a block diagram illustrating a phase-lock loop (PLL) circuit according to the related art.
Figure 2:
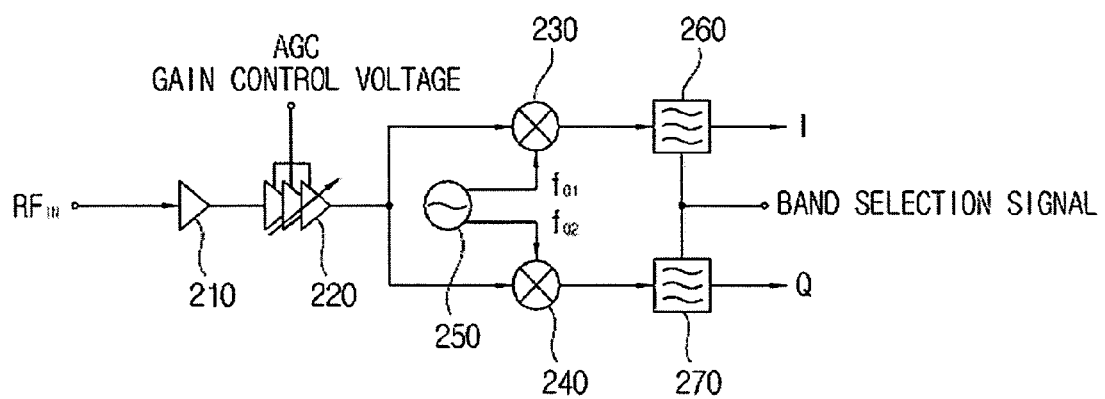
FIG. 2 is a circuit diagram showing a tuner of a wireless receiver using a VCO according to the related art.
Figure 3:
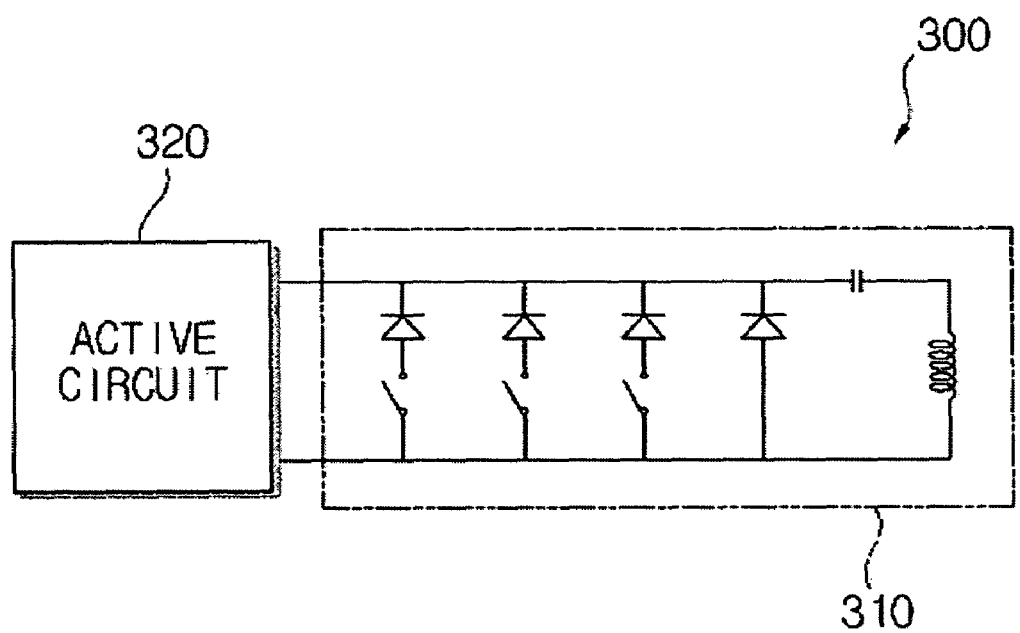
FIGS. 3 and 4 are block diagrams depicting conventional voltage controlled oscillators.
Figure 4:
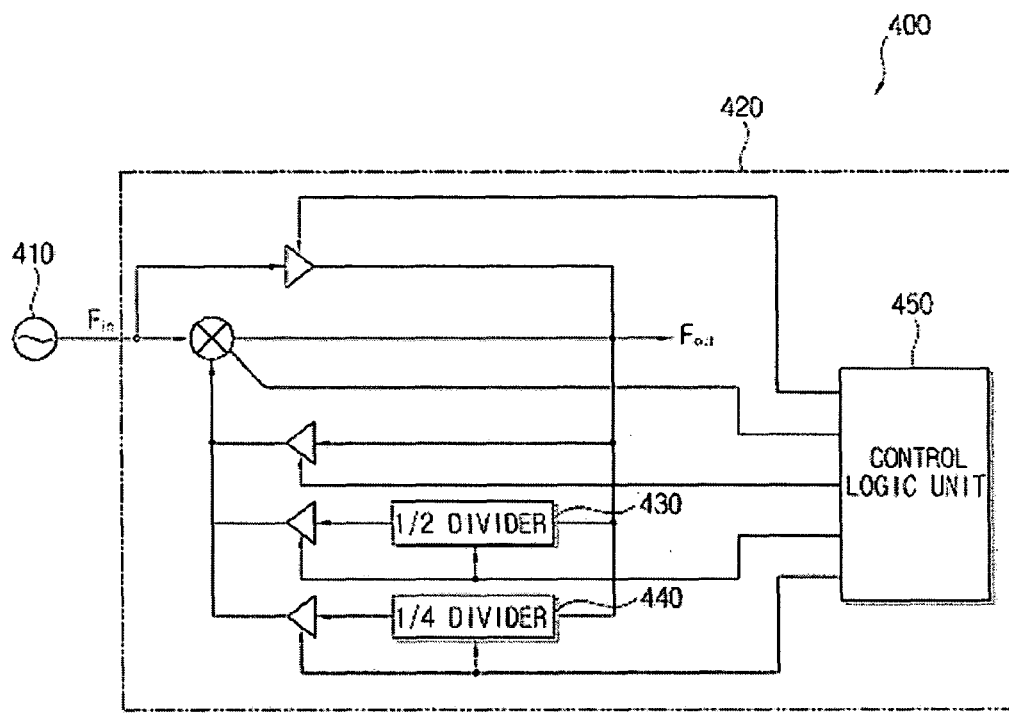
Figure 5:
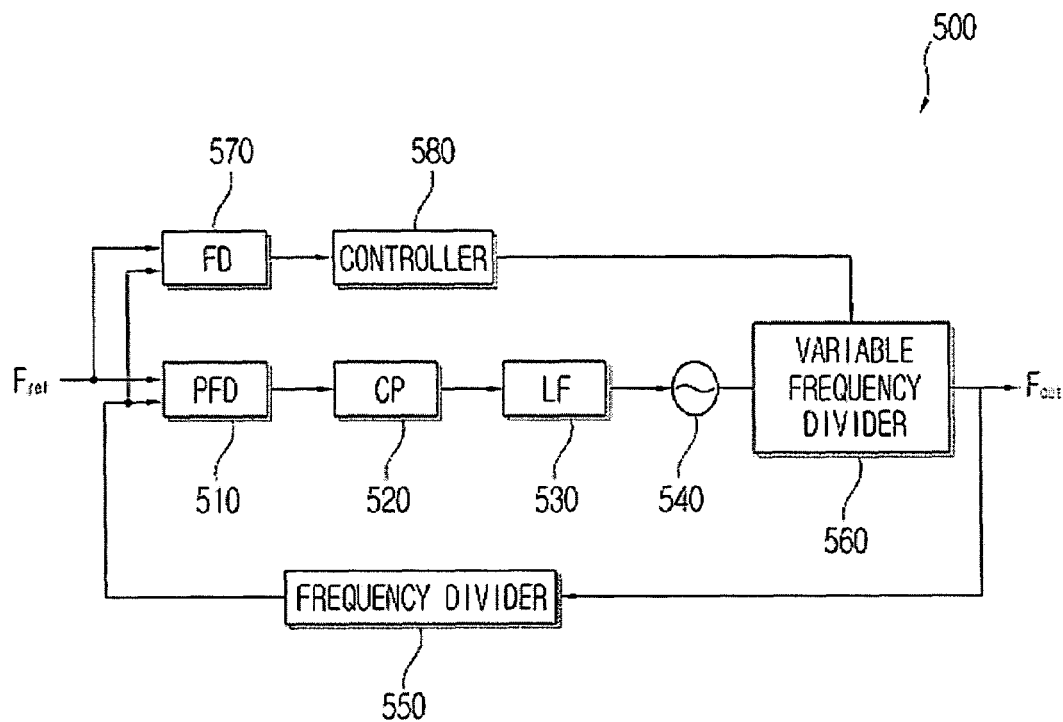
FIG. 5 is a block diagram illustrating an apparatus of oscillating a wideband frequency according to one embodiment of the present invention.

FIG. 5 is a block diagram illustrating an apparatus of oscillating a wideband frequency according to one embodiment of the present invention. The apparatus 500 includes a frequency divider 550, a phase frequency detector 510, a charge pump 520, a loop filter 530, a VCO 540, and a variable frequency divider 560.

The frequency divider 550 receives a feedback output signal $F_{out}$ and divides the feedback output signal $F_{out}$ to a predetermined frequency. The phase frequency detector (PFD) 510 receives a reference signal $F_{ref}$ from an external device and a frequency output from the frequency divider 550, and detects a phase difference and a frequency difference between the reference signal $F_{ref}$ and the received frequency. The charge pump (CP) 520 charges and discharges a loop filter (LF) 530 by receiving the phase difference and the frequency difference output from the PFD 510. The LF 530 eliminates radio frequency elements from a signal output from the CP 520. The voltage-controlled oscillator (VCO) 540 generates a frequency proportional to a voltage of the LF 530. And, the variable frequency divider 560 outputs an output frequency Fout by dividing a radio frequency alternating current signal output from the VCO 540 according to a variable division ratio M.

The apparatus also includes a frequency detector (FD) 570 and a controller 580. The frequency detector extracts a frequency difference by comparing the feedback frequency divided from the frequency divider 550 and the reference frequency $F_{ref}$. The controller controls the variable division ratio M of the variable frequency divider 560 based on the extracted frequency difference from the FD.

The PFD 510 detects the frequency difference and the phase difference between the feedback output signal and the reference signal as described above. A phase detector may be used as a conventional phase-lock loop (PLL) circuit element instead of using the PFD. The PFD generates a pulse signal in response to the phase difference and the frequency difference between the two signals.

The CP 520 generates a voltage signal to control the VCO 540 by charging or discharging a charge in the LF 530, based on the generated pulse signal from the PFD 510.

The LF 530 performs lowpass filtering to eliminate harmonic elements which may be generated while detecting the frequency/phase difference. The LF is preferably configured with a capacitance element and an resistive element.

The VCO 540 includes an active circuit for oscillating and outputting a frequency signal generated from a resonating circuit. The resonating circuit has an inductance element and a capacitance element for determining the frequency. A range of oscillating operations of the VCO 540 is determined by a capacitance value C and an inductance value L in the resonating circuit. A detailed configuration of the VCO 540 will be explained in greater detail below.

The frequency divider 550 and the variable frequency divider 560 reduces the frequency from the VCO by counting frequencies. The frequency divider 550 and the variable frequency divider 560 may be embodied, for example, as a flip-flop although other circuits may just as easily be used. The frequency divider has a constant division ratio K which is fixed according to a target oscillating frequency. The variable frequency divider has a variable division ratio M controlled by the controller 580 to approach to a target oscillating frequency band.

The FD 570 detects a frequency difference of two frequencies similar to the PFD 510. More specifically, the FD 570 detects a frequency difference by comparing a divided signal based on the variable division ratio M and a reference frequency $F_{ref}$ according to the present embodiment. The controller 580 controls the variable division ration M of the variable frequency divider 560 according to the detected frequency difference in the FD 570.

The controller 580 may be embodied, for example, as a module of a microprocessor that generally controls a receiving system having the apparatus 500 of oscillating a wideband frequency.

The controller 570 reduces the variable division ratio M to increase an output frequency when the feedback frequency divided based on the controlled variable division ratio M is smaller than the reference frequency $F_{ref}$. The controller 570 also increases the variable division ratio M to decrease the output frequency when the feedback frequency, divided based on the controlled variable division ratio M, is larger than the reference frequency $F_{ref}$. The controller 580 fixes the variable division ratio M of the variable frequency divider 560 when the output frequency approaches a target oscillating frequency, through such a controlling procedure performed by the variable division ratio M. As described above, the target output frequency $F_{out}$ can be oscillated using the VCO, where the operation range is limited by the variable frequency divider 560 set to a variable division ratio according to the present embodiment.

Also, a specific oscillating frequency may advantageously be controlled by varying the capacitance value of a resonating element in the resonating circuit of the VCO 540.

Also, although not shown in FIG. 5, apparatus 500 may further include a unit for generating an I signal and a Q signal having 90° phase difference, and having a frequency identical to the output frequency $F_{out}$ using the output frequency $F_{out}$.

Figure 6:
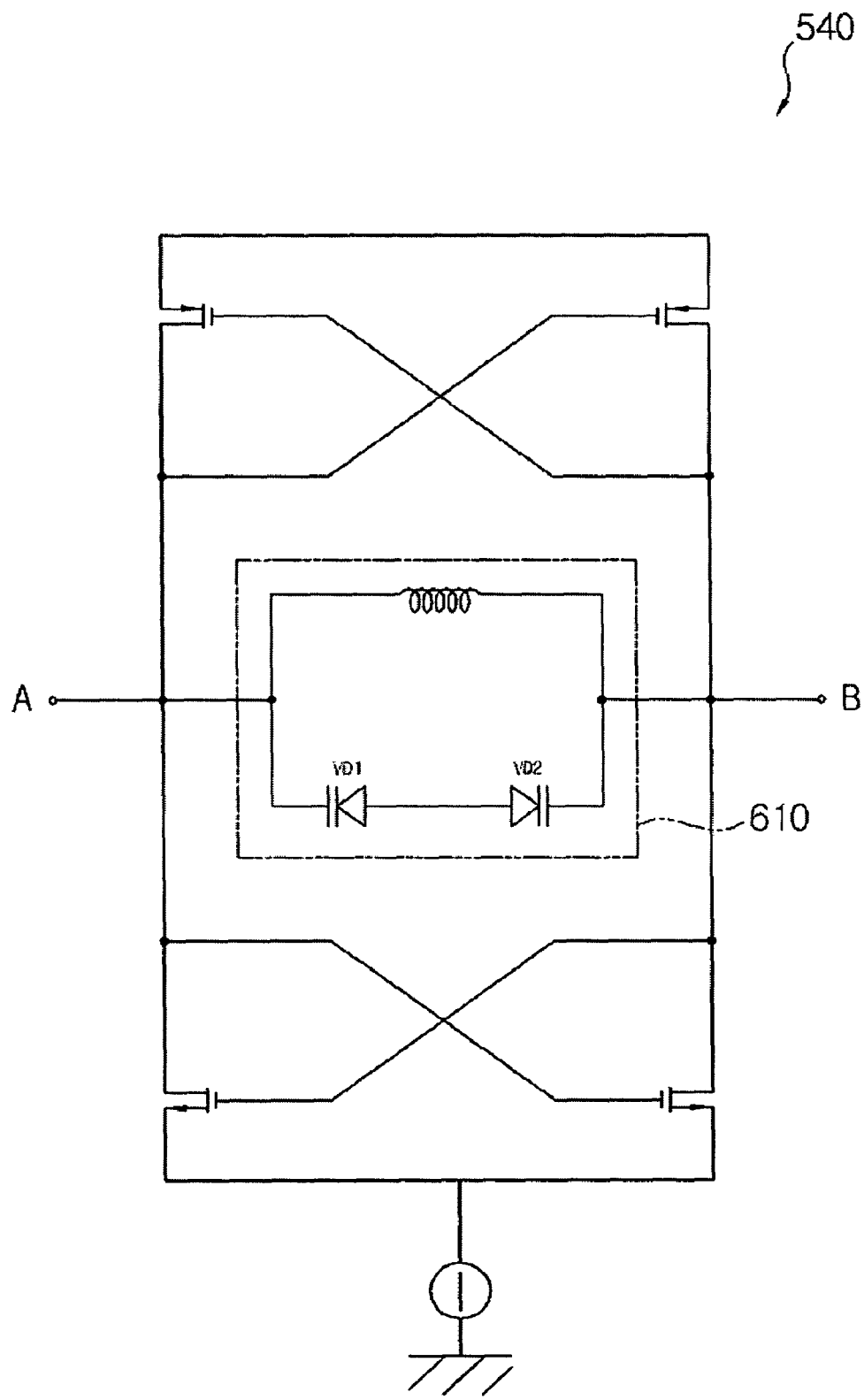
FIG. 6 is a circuit diagram showing a voltage controlled oscillator (VCO) which may be included, for example, the apparatus of FIG. 5, according to an embodiment of the present invention.

FIG. 6 is a circuit diagram showing a voltage-controlled oscillator according to one embodiment of the present invention. This VCO 540 includes a resonating circuit 610 having a capacitance element and an inductance element for resonating a frequency and a plurality of varactor diodes VD1, VD2 having variable capacitance values which are varied according to one or more applied voltages.

A resonant frequency is decided in inverse proportion to capacitance value C and inductance value L of the resonating circuit. Accordingly, an oscillating frequency of the VCO 540 can be varied by controlling the applied voltage of the varactor diodes VD1 and VD2.

In the present embodiment, the resonating circuit 610 includes two varactor diodes VD1, VD2. However, the present invention is not limited to this number of diodes or having the varactor diodes in the resonating circuit 610. For example, the resonating circuit may alternatively include a plurality of capacitances and a plurality of switches connected to the capacitances instead of the varactor diodes. Such a resonating circuit oscillates various resonant frequencies by controlling the switches to diversely combine capacitance values.

Furthermore, the resonating circuit 610 may be implemented by including a plurality of LC tank circuits. Such a resonating circuit having multiple LC tanks may generate a resonant frequency, for example, by selecting one of LC tanks according to a target frequency. Various other technologies may be applied to control a resonant frequency in the resonating circuit 610, and a method of applying the technologies for controlling of resonant frequency in the resonating circuit 610.

Figure 7:
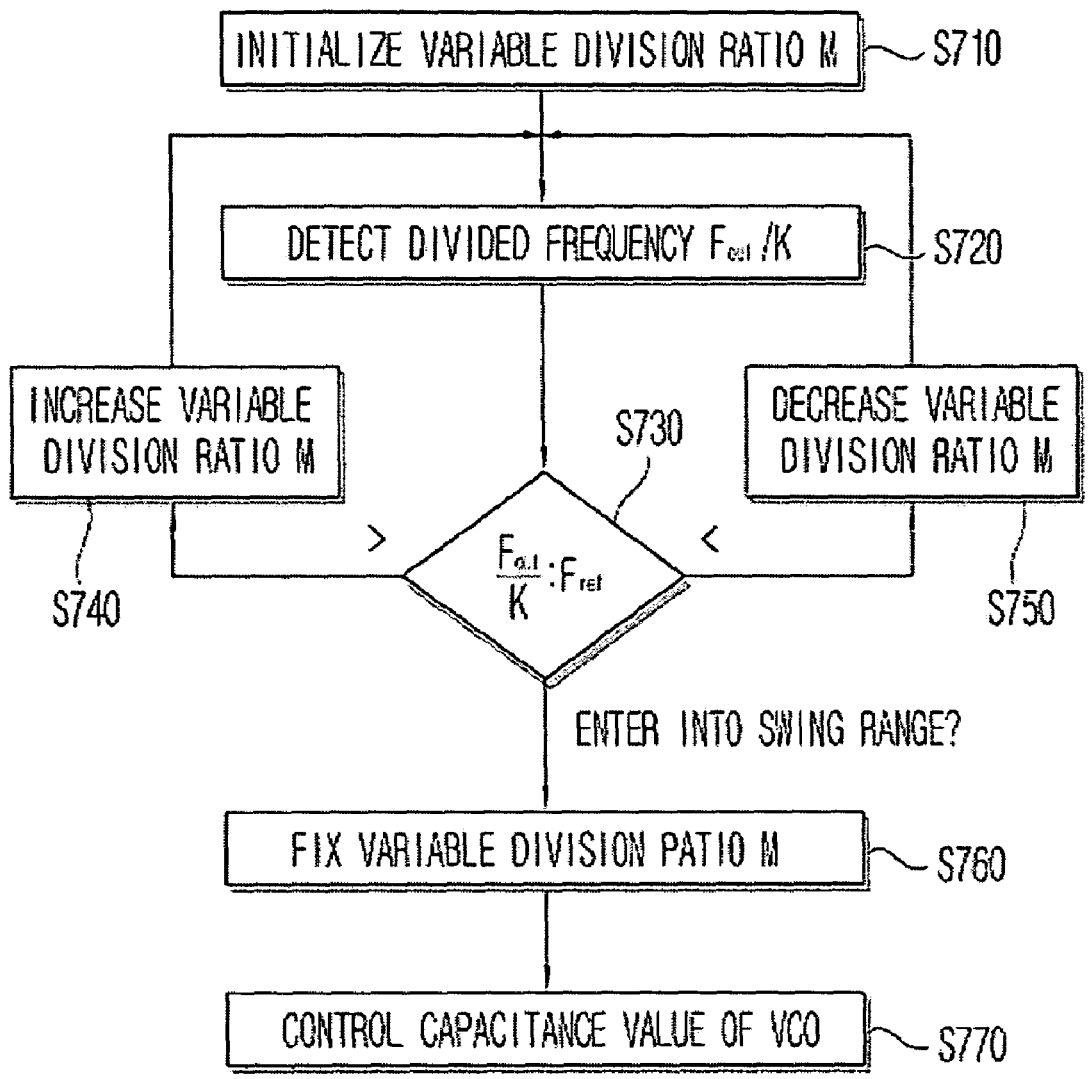
FIG. 7 is a flowchart showing steps that may be included in a method of oscillating a wideband frequency according to one embodiment of the present invention.

FIG. 7 is a flowchart showing steps included in a method of oscillating a wideband frequency according one embodiment of the present invention. In this exemplary embodiment, an oscillating frequency is controlled within a range of bands from about 174 MHz to 240 MHz, which is required in a digital audio broadcasting (DAB) standardized in ESTI EN 300 744. Those skilled in the art can appreciate that the present invention is not intended to be limited to this range of frequencies or to this application.

Referring to FIG. 7, the variable division ratio M of the variable frequency divider 560 is initialized in operation S710. In order to clearly show the present embodiment, it is assumed that the division ratio K of the frequency divider 550 is fixed to 17.4, the VCO 540 oscillates radio frequency alternate current frequencies in a range from about 2200 MHz to about 3200 MHz, and the reference frequency $F_{ref}$ is 10 MHz.

If the variable division ratio M is initialized to 12, the frequency divider 550 receives frequencies from about 2200/12 MHz to about 3200/12 MHz (that is, 183.33 to 266.66 MHz), and fed back frequencies divided at 174.4 are in a range from about 10.54 MHz to about 15.33 MHz.

The FD 570 detects an alternate current frequency fed back and operated in a predetermined frequency range, and compares the detected alternate current frequency to the reference frequency $F_{ref}$ in operations S720 and S730. Various methods may be used to compare the detected alternate current frequency to the reference frequency $F_{ref}$. For example, a minimum frequency in the operation range of the detected alternate current frequency may be compared to the reference frequency $F_{ref}$ or a maximum frequency in the operation range of the detected alternate current frequency may be compared to the reference frequency $F_{ref}$. However, the present invention is not intended to be limited to any of the comparing methods. The present invention may be properly operated in a method comparing a predetermined one of frequencies in the operation range of the detected frequency and the reference frequency $F_{ref}$.

In the present embodiment, fed back alternate current frequencies in a range from about 10.54 MHz to about 15.33 MHz are compared to the reference frequency 10 MHz. If the comparison methods are applied to the present embodiment, a minimum frequency 10.54 MHz in the operation range of the detected alternate current frequency may be compared to the reference frequency 10 MHz. Also, a maximum frequency 15.33 MHz in the operation range of the detected alternate current frequency may be compared to the reference frequency 10 MHz. Furthermore, an average frequency 12.935 MHz of the maximum and the minimum frequency in the operating range may be compared to the reference frequency 10 MHz as described above. The average frequency is calculated by (10.54+15.33)/2.

According to a preferred embodiment of the present invention, the minimum frequency in the operation range of the detected alternate current frequency is compared to the reference frequency $F_{ref}$, and the maximum frequency in the operation range of the detected alternate current frequency is compared to the reference frequency $F_{ref}$.

If the minimum frequency is larger than the reference frequency Fref, the variable division ratio M is increased to lower the feedback frequency band in operation S740. In the present embodiment, since the minimum frequency 10.54 MHz is larger than the reference frequency 10 MHz, the variable division ratio M increases to 16. Preferably, the variable division ratio increases or decreases two times or four times in order to generate an In-phase (I) signal and a Quadrature (Q) signal having 90° phase difference from the output frequency $F_{out}$.

If the maximum frequency of the fed back alternate current frequency is smaller than the reference frequency $F_{ref}$, the variable division ratio M is reduced to increase the feedback frequency band in operation S750.

As described above, the variable division ratio M is repeatedly controlled until the reference frequency $F_{ref}$ is included in the operation range of the fed back alternate current frequency, and the variable division ratio M is fixed when the reference frequency $F_{ref}$ is included in the operation range of the fed back alternate current frequency in operation S760. In the shown embodiment, when the variable division ratio M is 16, the fed back alternate current frequency is in a range from about 7.9 MHz to about 11.49 MHz and the reference frequency 10 MHz is included in the operation range of the feed-backed alternate current frequency. Accordingly, the variable division ratio M is fixed to 16.

After fixing the variable division ratio M, a capacitance value of the resonating circuit in the VCO 540 is controlled to generate an oscillating frequency of a target frequency band in operation S770. The locking operation after fixing the variable division ratio M is similar to locking of a phase in a PLL. For example, if a LC oscillator is used, a predetermined capacitor value is selected for discrete capacitors to generate a frequency similar to a target frequency which is similar to a method of obtaining the variable division ratio M. Then, it is locked at the target frequency by an analog PLL. If a current oscillating frequency is higher than the target frequency, switches connected to a capacitor is operated to increase the capacitor value. Conversely, if the current oscillation frequency is lower than the target frequency, the switches are operated to reduce the capacitor value.

The apparatus and method of oscillating a wideband frequency according to the present invention can automatically trace and control the oscillating frequency to have a target frequency band, by dynamically controlling the variable division ratio according to a result of comparing the reference frequency and the fed back frequency without requiring a predetermined oscillating frequency table. The oscillating frequency table is previously set when a conventional frequency oscillating apparatus is manufactured. The conventional frequency oscillating apparatus then uses the oscillating frequency table for switching to a X LC tank using a X divider or using a x division value to oscillate a frequency in A frequency band, switching to a Y LC tank using a Y divider or using a y division value to oscillate a frequency in B frequency band or switching to a Z LC tank, and using a Z divider or using a z division value to oscillate a frequency in C frequency band. Such a conventional oscillating frequency table is not required in the present invention.

Although it is not shown in FIG. 7, an operation of generating an I signal and a Q signal used for I/Q demodulation may be included.

The above described operations according to the present embodiment may be controlled by the controller 580 or a microprocessor of a wireless receiving system where the apparatus 500 of oscillating a wideband frequency is implemented.

Also, the apparatus and method of oscillating a wideband frequency according to the present invention may oscillate wider bands of frequencies while maintaining a low phase noise. In order to oscillate a wideband frequency while maintaining superior phase noise characteristics, a tuning range of the VCO may be narrow. Although the tuning range of the VCO may be narrow in some embodiments of the present invention, the wideband frequency can be dynamically oscillated by changing a value of a variable divider.

Also, the apparatus and method of oscillating a wideband frequency according to the present invention preferably uses a single VCO. Therefore, integrity of a receiving system ncluding the apparatus of the present invention increases, since the apparatus of the present invention may have a comparatively smaller die area and a lower manufacturing cost.

Furthermore, the apparatus and method of oscillating a wideband frequency according to the present invention may accurately oscillate a frequency to provide an accurate target frequency, first, by controlling the variable division ratio to approach to a target frequency band and, second, by controlling a capacitance value of the VCO.

Moreover, apparatus and method of oscillating a wideband frequency according to the present invention may automatically perform trace and control functions to provide a target frequency, by controlling the variable division ratio according to a result of comparing the reference frequency and the fed-back frequency. A predetermined oscillating frequency matching table therefore is not required. Also, the apparatus and method of oscillating a wideband frequency according to the present invention may properly and more efficiently generate an I signal and a Q signal.

The apparatus and method of oscillating a wideband frequency according to the present invention may also prevent or avoid the effects of sub-harmonic signals which can be generated while mixing signals and which degrades performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for oscillating a frequency, comprising: frequency.
   a phase-locked loop circuit which generates a first frequency signal;
   a variable frequency divider which divides the first frequency signal by a division ratio to generate a second frequency signal that lies within a predetermined frequency band,
   a first detector in the phase-locked loop circuit to compare a first reference frequency signal and the second frequency signal;
   a second detector to compare a second reference frequency signal and at least a third frequency signal;
   a first controller to control the division ratio of the variable frequency divider based on a result of the comparison of the second reference frequency signal and at least the third frequency signal performed by the second detector; and
   a second controller to adjust a voltage-controlled oscillator of the phase-locked loop circuit to control the first frequency signal, wherein the first controller varies the second frequency signal by a first amount and the second controller varies the second frequency signal by a second amount to cause the second frequency signal to lie within said predetermined frequency band.

2. The apparatus of claim 1, wherein the voltage-controlled oscillator includes:
   a resonating circuit; and
   an active circuit which oscillates a signal output from the resonating circuit to form the first frequency signal, the second controller adjusting a parameter of the resonating circuit to adjust the second frequency signal by said second amount.

3. The apparatus of claim 2, wherein the the parameter is a capacitance value of the resonating circuit which is varied based on an applied voltage.

4. The apparatus of claim 1, wherein the resonating circuit includes:
   a plurality of LC tank circuits for generating resonant frequencies;
   a switching circuit for selecting one of the LC tanks to generate the first frequency signal.

5. A method for oscillating a frequency, comprising:
   generating a first frequency signal from a phase-locked loop;
   dividing the first frequency signal by a division ratio to generate a second frequency signal that lies within a predetermined frequency band, the division ratio being varied based on a comparison of a reference frequency signal and feedback frequency signal input into the phase-locked loop;
   comparing a first reference frequency signal and the second reference frequency signal using a first detector;
   comparing a second reference frequency signal and at least a third frequency signal using a second detector;
   controlling the division ratio based on a result of the comparison of the second reference frequency signal and at least the third frequency signal; and
   adjusting a voltage-controlled oscillator of the phase-locked loop to control the first frequency signal wherein controlling the division ratio varies the second frequency signal by a first amount and adjusting the voltage-controlled oscillator varies the second frequency signal by a second amount to cause the second frequency signal to lie within said predetermined frequency band.

6. The method of claim 5, wherein the voltage-controlled oscillator includes:
   a resonating circuit; and
   an active circuit which oscillates a signal output from the resonating circuit to form the first frequency signal. said adjusting including adjusting a parameter of the resonating circuit to adjust the second frequency signal by said second amount.

7. The method of claim 6, wherein the parameter is a capacitance value which is varied based on an applied voltage.

8. The method of claim 5, wherein the resonating circuit includes:
- a plurality of LC tank circuits for generating resonant frequencies;
- a switching circuit for selecting one of the LC tanks to generate the first frequency signal.

9. The apparatus of claim 1, wherein the first reference frequency signal is equal to the second reference frequency signal.

10. The apparatus of claim 1, wherein the first controller and second controller are different circuits.

11. The apparatus of claim 1, wherein the second frequency signal is divided by a fixed value before being compared by the first detector.

12. The apparatus of claim 1, wherein the third frequency signal corresponds to a minimum frequency of said predetermined frequency band, the first controller increasing the division ratio of the variable frequency divider when the minimum frequency is greater than the second reference frequency signal to lower the second frequency signal to a value which lies within said band.

13. The apparatus of claim 12, wherein, if the minimum frequency is less than the second reference frequency signal, the first controller compares the second reference frequency signal to a fourth frequency signal which corresponds to a maximum frequency of said predetermined frequency band, the first controller reducing the division ratio of the variable frequency divider when the maximum frequency is less than the second reference frequency signal to increase the second frequency signal to a value which lies within said band.

14. The apparatus of claim 1, wherein the third frequency signal corresponds to an average frequency of said predetermined frequency band.

15. The apparatus of claim 1, wherein the third frequency signal is based on the second frequency signal.

16. The apparatus of claim 1, wherein the second frequency signal corresponds to an output frequency of the phase-locked loop circuit, said phase-locked loop circuit included in a tuner of a communication device which generates a baseband signal or RF signal based on the output frequency.

17. The method of claim 5, wherein the first reference frequency signal is equal to the second reference frequency signal.

18. The method of claim 5, wherein the second frequency signal is divided by a fixed value before being compared to the first reference frequency signal.

19. The method of claim 5, wherein the third frequency signal corresponds to a minimum frequency of said predetermined frequency band and wherein said controlling includes:
- increasing the division ratio when the minimum frequency is greater than the second reference frequency signal to lower the second frequency signal to a value which lies within said band.

20. The method of claim 19, wherein, if minimum frequency is less than the second reference frequency signal, said method further includes:
- comparing the second reference frequency signal to a fourth frequency signal corresponding to a maximum frequency of said predetermined frequency band; and
- reducing the division ratio when the maximum frequency is less than the second reference frequency signal to increase the second frequency signal to a value which lies within said band.

21. The method of claim 5, wherein the third frequency signal corresponds to an average frequency of said predetermined frequency band.

22. The method of claim 5, wherein the third frequency signal is based on the second frequency signal.

23. The method of claim 5, wherein the second frequency signal corresponds to an output frequency of the phase-locked loop circuit, said phase-locked loop circuit included in a tuner of a communication device which generates a baseband signal or RF signal based on the output frequency.

* * * * *